United States Patent [19]
Hashimoto

[11] Patent Number: 5,638,026
[45] Date of Patent: Jun. 10, 1997

[54] HIGH INPUT IMPEDANCE CIRCUIT AND SEMICONDUCTOR INTEGRATED DEVICE PROVIDED THEREWITH

[75] Inventor: Masaru Hashimoto, Yokohama, Japan

[73] Assignee: Kabushiki Kaisha Toshiba, Kawasaki, Japan

[21] Appl. No.: 508,526

[22] Filed: Jul. 28, 1995

[30] Foreign Application Priority Data

Jul. 29, 1994 [JP] Japan ................................ 6-197362

[51] Int. Cl.[6] .................... H03F 3/45; G11B 5/02
[52] U.S. Cl. .................... 330/260; 330/261; 330/156; 360/67
[58] Field of Search ..................... 330/156, 252, 330/260, 261; 360/67, 68

[56] References Cited

U.S. PATENT DOCUMENTS 4,451,800  5/1984  Nishioka et al. ................... 330/261
5,333,138  7/1994  Richards et al. ................... 360/60 X

FOREIGN PATENT DOCUMENTS 61-18019  1/1986  Japan.
5-80005  11/1993  Japan.

*Primary Examiner*—James B. Mullins
*Attorney, Agent, or Firm*—Oblon, Spivak, McClelland, Maier & Neustadt, P.C.

[57] ABSTRACT

A high input impedance circuit includes an amplifier such as an operational amplifier comprising transistors of a first polarity which serve as a differential pair and input of the amplifier, base of one transistor being caused to serve as a positive input terminal, base of the other transistor being caused to serve as a negative input terminal. The high input impedance circuit further includes a transistor having base connected to the positive input terminal, and a second polarity opposite to the first polarity, wherein collector of the transistor of the second polarity is connected through d.c. path to a first power supply, e.g., ground, and emitter of the transistor of the second polarity is connected through d.c. path to a second power supply, e.g., power supply voltage terminal through a resistor to apply a signal in phase with an input signal delivered to the positive input terminal to the emitter of the transistor of second polarity to thereby allow input impedance to be higher. In addition, a semiconductor device provided with such a high input impedance circuit is also provided.

18 Claims, 3 Drawing Sheets

HIGH INPUT IMPEDANCE CIRCUIT AND SEMICONDUCTOR INTEGRATED DEVICE PROVIDED THEREWITH

BACKGROUND OF THE INVENTION

1. Field of the Invention

This invention relates a high input impedance circuit used for the purpose of realizing, by a semiconductor integrated circuit, an amplifier having, e.g., an input impedance of several hundreds K ohms~several tens M(mega) ohms, which is necessary as a detector for taking out a very small voltage produced from a high impedance element.

2. Description of the Background Art

Generally, sensors used for various measurements tend to need considerably high input impedance. For example, it is now common to provide a shock sensing device to maintain reliability in writing/reading a hard disk drive, by detecting a vibration or a shock such that any error takes place during read/write operation and carrying out read/write operation for second time. The shock sensor, for example a ceramic element of a piezoelectric bimorph type, used to detect the shock has a high impedance, e.g. tens of picofarad(pF) and the shock sensing device must have an input buffer amplifier which can amplify a very small voltage produced from the high impedance element.

Hitherto, in order to realize high input impedance, a bias was applied, by, e.g., a resistor of 20M ohms to input of an amplifier (operational amplifier) to realize such a high input impedance. However, even if, e.g., an input current of an operational amplifier is 50 n(nano)A, a voltage drop of 1 volt takes place since the bias resistance value is so high. For this reason, as shown in FIG. 5, At was necessary to use an operational amplifier using an FET in a first stage where there is hardly an input current.

However, in order to realize such a function as an integrated circuit, since MOS structure is added, process of Bipolar-CMOS (BiCMOS) must be implemented to a semiconductor substrate for the purpose of manufacturing. In addition, in order to form a resistor of 20M ohms on a semiconductor substrate, chip area must be enlarged. Alternatively, since manufacturing is difficult from an economical point of view, it was necessary to externally mount such a resistor as a bias resistor.

FIG. 5 shows a conventional high input impedance circuit of an operational amplifier having MOSFET. An operational amplifier 10 has a positive input terminal and a negative input terminal, and an output terminal connected to an output terminal OUT. The positive input terminal is connected to an input terminal IN and is connected to one end of a resistor R1 of 20M ohms. Further, the positive input terminal is grounded through the resistor R1 and a power supply VB, and is biased by the resistor R1 and the power supply VB. In addition, an output signal is fed back to the negative input terminal. As stated above, in this conventional high input impedance circuit, input impedance of the operational amplifier is defined by the resistor R1.

Moreover, FIG. 6 shows another conventional example of an impedance circuit described in the Japanese Patent Application Laid-open Publication No. 61-18019 (1986) (Japanese Patent Publication No. 5-800005(1993). This circuit is a high input impedance circuit such that, e.g., base of a lateral PNP transistor Q20 is connected to base of an NPN transistor Q10 to deliver a bias voltage to emitter of the lateral PNP transistor Q20. Collector of the NPN transistor Q10 is connected to power supply (not shown), and its emitter is grounded through a current source 11. The base of the transistor Q10 is connected to an input terminal 12, and is connected to the base of the lateral transistor Q20. Collector of the transistor Q20 is grounded and emitter thereof is grounded through a resistor R and a power supply V1. In order to allow operating voltage (base voltage) of the transistor Q10 to be stable, when current amplification factor (hfe) of the transistor Q20 is caused to be smaller that of the transistor Q10, since it is possible to constitute a circuit having input impedance of 50K ohms or more only by, e.g., resistor R of about 1K ohms and a single lateral transistor, increase in chip area can be suppressed. However, in order to obtain, e.g., high input impedance of 20M ohms ~60M ohms, a resistor above 1M ohms is required. Therefore, employment of such a resistor is difficult in view of allowing such a circuit to be integrated within a semiconductor substrate.

As previously described, in order to allow an amplifier of which input impedance is high impedance of several hundreds K ohms~ several tens M ohms to be within a semiconductor substrate, high-resistance (high impedance resistor) of the order of M ohms or more is required, and such a resistor had to be externally attached (mounted) separately from the semiconductor substrate on which the amplifier is formed. Moreover, even if attempt is made to implement integration, it was necessary to utilize BiCMOS process in which process steps would become complicated.

SUMMARY OF THE INVENTION

This invention has been made in view of such actual circumstances, and its object is to provide a high input impedance circuit which can be constructed only by hi-polar process without necessity of large resistor, and there is thus no necessity of eternal attachment (mounting), and a semiconductor device provided with such a circuit.

According to the first aspect of the present invention, there is provided a high input impedance circuit comprising:

an amplifier including first and second transistors of a first polarity, base of the first transistor being caused to serve as a positive input terminal, and base of the second transistor being caused to serve as a negative input terminal, a transistor of the second polarity which is opposite to the first polarity having a base connected to the positive input terminal, collector connected to a first power supply, and emitter connected to a second power supply through a first resistor, and an impedance increasing means for increasing input impedance viewed from the positive input terminal of the amplifier on the basis of the relation between currents which flow through the third transistor by an input signal and an output signal.

The impedance increasing means is preferably a resistor which is connected between the emitter of the third transistor and output terminal of the amplifier.

According to the second aspect of the present invention, there is provided a high input impedance circuit comprising:

an amplifier including a first and second transistors of a first polarity serving as a differential pair and constituting input stage of the amplifier, base of first transistor of the transistors of the first polarity being caused to serve as a positive input terminal, base of the second transistor of the transistors of the first polarity being caused to serve as a negative input terminal;

a third transistor of a second polarity opposite to the first polarity, having base connected to the positive input terminal, and means for providing signal of a same phase as an input signal applied to the input terminal, for emitter of the third transistors.

By applying a signal in phase with an input signal to emitter of the transistor whose base is connected to the positive input terminal of the amplifier, input impedance is caused to be higher, thus making it unnecessary to utilize such a high-resistance (high impedance resistor) which must be externally attached.

Furthermore, according to the third aspect of the present invention, there are provided semiconductor devices in which the high input impedance circuits having abovementioned constructions are respectively formed on a semiconductor substrate.

Still further, according to the fourth aspect of the present invention, there are provided shock sensing devices each having the semiconductor device and a shock sensor connected to the positive input terminal.

DESCRIPTION OF THE PREFERRED EMBODIMENTS

Preferred embodiments of this invention will now be described with reference to the attached drawings.

Figure 1:
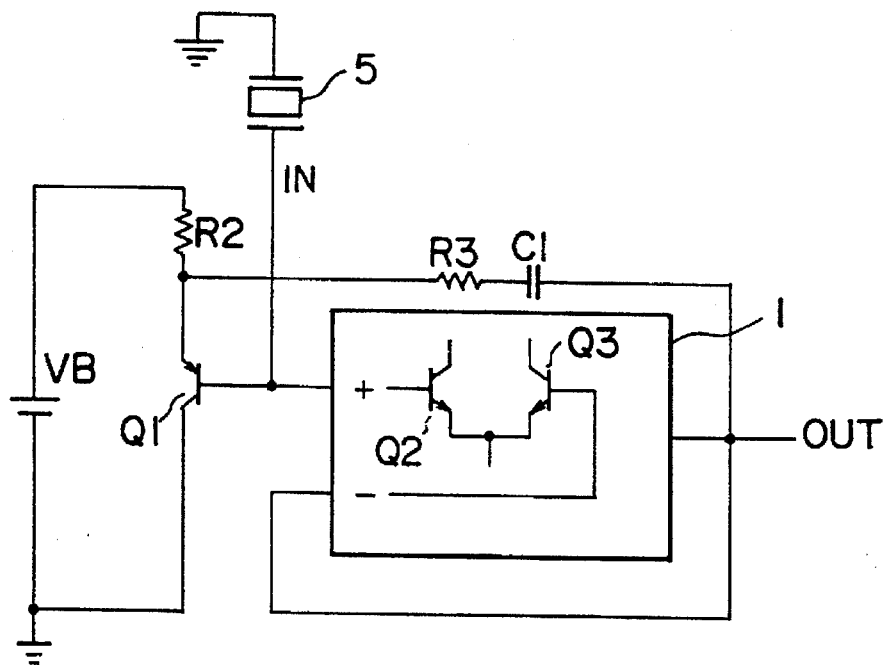
FIG. 1 is a circuit diagram of a high input impedance circuit of a first embodiment of this invention.

Initially, a first embodiment will be described with reference to FIG. 1. FIG. 1 is a circuit diagram of a high input impedance circuit. An operational amplifier 1 is comprised of one NPN transistor Q2 and the other NPN transistor Q3 which constitute a differential pair, and emitters of the both transistors are connected to each other. Base of one NPN transistor Q2 is caused to serve as a positive input terminal and base of the other NPN transistor is caused to serve as a negative input terminal. At the positive input terminal, a shock sensor 5 with the other terminal grounded, for example, is connected.

With respect to this operational amplifier 1, this high input impedance circuit also includes a PNP transistor Q1. Base of the PNP transistor Q1 is connected to the positive input terminal of the operational amplifier 1, and collector of the PNP transistor Q1 is connected to a first power supply (ground). Emitter of the PNP transistor Q1 is connected to a second d.c. power supply VB through a resistor R2. An input terminal IN is connected to the positive input terminal of the operational amplifier 1, and is also connected to base of the PNP transistor Q1. The operational amplifier 1 is of a structure in which an output signal therefrom is fed back to the negative input terminal thereof. Output terminal of such an operational amplifier 1 is connected to emitter of the PNP transistor Q1 through a resistor R3 and a capacitor C1 connected in series with the resistor R3. The function of the capacitor C1 is to cut d.c. component in a signal. Accordingly, a signal in phase with an input signal applied to the positive input terminal will be applied to the emitter of the PNP transistor Q1. As a result, input impedance is caused to have a higher value. The output terminal of the operational amplifier 1 is also connected to the output terminal OUT.

In the impedance circuit shown in FIG. 1, when the operational amplifier side is viewed from input, since the operational amplifier serves as a buffer in which full feedback is applied from the output to the negative input terminal, input impedance is caused to have a very higher value. Accordingly, this input impedance value becomes a value obtained by multiplying sum of resistor R2 and internal resistance value of PNP transistor Q1 by current amplification factor (hfe) of the PNP transistor Q1 in the case where resistor R3 and capacitor C1 are not connected when viewed from the bias side constituted with the PNP transistor Q1. Namely, such input impedance value becomes equal to an input impedance Of the PNP transistor Q1 of grounded emitter.

Let now consider the state where capacitor C1 and resistor R3 are connected (the above-mentioned internal resistor is omitted from the simplification of calculation A current change (I2) of resistor R2 by an input signal Vi is expressed below:

$$I2=Vi/R2 \qquad (1)$$

A current (I3) flowing in the resistor R2 by an output current is expressed below:

$$I3=Vi/(R2+R3) \qquad (2)$$

Moreover, since current change (I1) of the PNP transistor Q1 is a difference between current values I3 and I2, the current change (I1) is expressed as follows:

$$I1=I2-I3=Vi \times R3/R2(R2+R3) \qquad (3)$$

Accordingly, input impedance in the case where resistor R3 is caused to intervene in providing feedback of an output signal is multiple of I2/I1 when compared to the case where no resistor R3 is added (i.e., is I2/I1 times greater than that). This factor (magnification) is expressed in terms of resistance as follows:

$$I2/I1=(R2+R3) \qquad (4)$$

As stated above, since this embodiment permits input impedance of the operational amplifier to be higher without use of high-resistance, it is possible to realize an input impedance circuit of high impedance on a semiconductor substrate without externally attaching high impedance resistor of, e.g., 20M ohms or more. In addition, since there is no necessity of using FET as the operational amplifier, it is possible to form, by bipolar process, a semiconductor device provided with such an input impedance circuit. Accordingly, in accordance with this invention, an amplifier having an input impedance of several hundreds K ohms~ several tens M ohms can be realized within a semiconductor integrated circuit. This amplifier is effective for an input buffer amplifier for amplifying a very small voltage produced from a high impedance element such as ceramic element, etc.

Figure 2:
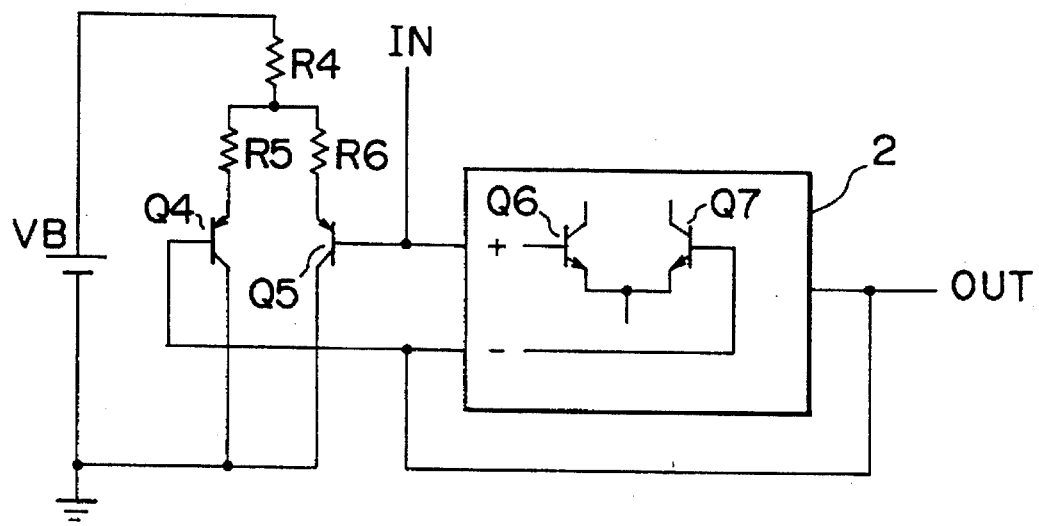
FIG. 2 is a circuit diagram of a high input impedance circuit of a second embodiment of this invention.

A second embodiment of the present invention will now be described with reference to FIG. 2.

The figure is a circuit diagram of high input impedance circuit. An operational amplifier 2 is comprised of one NPN transistor Q6 and the other NPN transistor Q7 which serve as a differential pair, and emitters of the both transistors are connected to each other. Base of one NPN transistor Q6 is caused to serve as a positive input terminal, and base of the other NPN transistor Q7 is caused to serves as a negative input terminal. With respect to such operational amplifier 2, this high input impedance circuit includes a first PNP transistor Q5. Base of this first PNP transistor Q5 is connected to the positive input terminal of the operational amplifier 2, and collector of the first PNP transistor Q5 is d.c.-connected to first power supply (ground). Further, emitter of the first PNP transistor Q5 is connected to second power supply VB through a resistor R4 and a resistor R6 connected in series with the resistor R4. Input terminal IN is connected to the positive input terminal of the operational amplifier 2, and is also connected to base of the first PNP transistor Q5. The operational amplifier 2 is of a structure in which its output terminal is connected to output terminal OUT, and an output signal is negative-fed back to the negative input terminal of the operational amplifier 2.

While, in the first embodiment, only one transistor is provided as the PNP transistor, in this embodiment, a second PNP transistor Q4 and a resistor R5 connected thereto are additionally provided. Emitter of the second PNP transistor Q4 is connected to emitter of the first PNP transistor Q5 through a resistor R5 connected in series with the resistor R4 and the above-mentioned resistor R6, and collector of the second PNP transistor Q4 is grounded. In addition, base of the second PNP transistor Q4 is connected to the negative input terminal of the operational amplifier 2.

In the case where second PNP transistor Q4 and resistor R5 do not exist, when current amplification factor of the first PNP transistor Q5 is assumed to be hfe Q5 and internal resistance thereof is assumed to be re, input impedance (Rin) of this circuit is expressed as follows:

$$Rin = hfe\ q5 \times (R4 + R6 + re) \quad (5)$$

While current change of resistor R4 by an input signal resulting from the fact that second PNP transistor Q4 and resistor R5 are added is the same as that in the case where second PNP transistor Q4 and resistor R5 do not exist, change of a current flowing through the first PNP transistor Q5 becomes one half in the case where, e.g., Q4=Q5 and R5=R6. Accordingly, input impedance becomes double.

In order to allow input impedance to have a larger value, ratio between currents flowing in the first and second PNP transistors Q5, Q4 is varied. For example, when setting is made such that Q4:Q5=9:1 and R5:R6=1:9, this input impedance takes a value ten times ((R5+R6)/R5=(9+1)/1= 10) greater than that in the original state.

As described above, in this embodiment, input impedance of the operational amplifier is permitted to be higher without use of high impedance resistor. Accordingly, it is possible to realize an input impedance circuit of high impedance on the semiconductor substrate without externally attaching (mounting) high impedance resistor of 20M ohms or more. In addition, since there is no necessity of using FET as the operational amplifier, it is possible to form, by bipolar process, a semiconductor device provided with such an input impedance circuit. Particularly, in this embodiment, since capacitor of large capacity which is not suitable for assembling a high input impedance circuit within the semiconductor substrate is eliminated, realization of a semiconductor integrated circuit is facilitated.

In this embodiment, since the output signal is fed back to the negative side input terminal and the base of the transistor Q4, signals at emitters of the transistors Q4 and Q5 have the same phase with the output signal as in the manner of the first embodiment.

Figure 3:
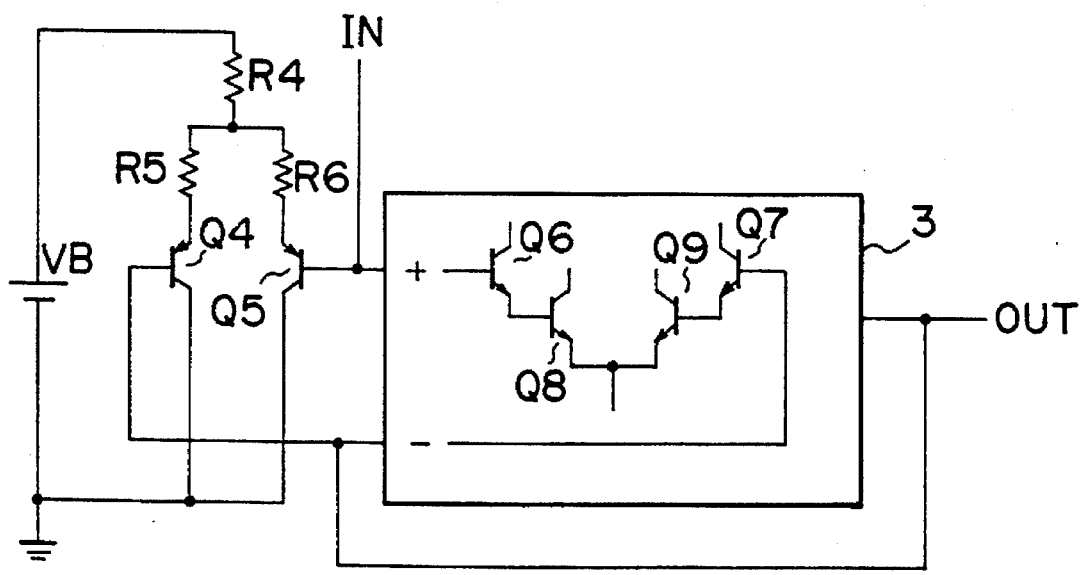
FIG. 3 is a circuit diagram of a high input impedance circuit of a third embodiment of this invention.

A third embodiment will now be described with reference to FIG. 3.

The figure is a circuit diagram of a high input impedance circuit. An operational amplifier 3 comprises a first NPN transistor Q6 and a second NPN transistor Q7 which serve as a differential pair, and emitters of the both transistors are connected to each other through a third NPN transistor Q8 and a fourth NPN transistor Q9. Namely, emitter of the first NPN transistor Q6 is connected to base of the third NPN transistor Q8, and emitter of the second NPN transistor Q7 is connected to base of the fourth NPN transistor Q9. Such connection is generally called as Further, emitters of the third NPN transistor Q8 and the fourth NPN transistor Q9 are connected to each other. In addition, base of the first NPN transistor Q6 is caused to serve as a positive input terminal and base of the second NPN transistor Q7 is caused to serve as a negative input terminal. With respect to the operational amplifier 3, this high input impedance circuit includes first PNP transistor Q5. Base of the first PNP transistor Q5 is connected to the positive input terminal of the operational amplifier 3, end collector of the first PNP transistor Q5 is grounded. Emitter of the first PNP transistor Q5 is connected to power supply VB through resistor R4 and resistor R6 connected is series with the resistor R4. Input terminal IN is connected to the positive input terminal of the operational amplifier 3, and is also connected to the base of the first PNP transistor Q5. The operational amplifier is of a structure in which Its output terminal is connected to output terminal OUT, and an output signal is fed back to the negative input terminal of the operational amplifier 3. In this embodiment, similarly to the second embodiment, second PNP transistor Q4 and resistor R5 connected thereto are additionally provided. Emitter of the second PNP transistor Q4 is connected to emitter of the first PNP transistor Q5 through the resistor R5 and the resistor R6 connected in series with the resistor, and collector thereof is grounded. In addition, base of the second PNP transistor Q4 is connected to the negative input terminal of the operational amplifier 3.

In the high input impedance circuit of this embodiment, improvement is further made in order to obtain input impedance of several tens M ohms. In the high input impedance circuit of FIG. 2, in the case where assumption is made such that current amplification factors (hfe) of the NPN transistors and the PNP transistors are all the same and a ratio between current amplification factor of the transistor Q4 and that of the transistor Q5 is set to Q4:Q5=9:1, when, e.g., a current caused to flow through the first NPN transistor Q6 is set to 5 μA, current of 5 μA and current of 45 μA will flow in the first PNP transistor Q5 and the second PNP transistor Q4, respectively. Assuming now that R4 is set to 100K ohms, voltage drop of the resistor R4 becomes as far as 5 volts. As a result, high power supply voltage is required. In addition, value of voltage drop of the resistor R4 becomes uneven by difference between current amplification factor (hfe) of the NPN transistor and that of the PNP transistor, thus failing to obtain a stable d.c. operating point.

This embodiment is characterized in that third and fourth NPN transistors Q8 and Q9 connected as Darlington connection are additionally provided at the input of the operational amplifier in order to solve the above-mentioned problem. In this case, when resistance value of the resistor R4 is set to 100K ohms under the same condition as the above, voltage drop of the resistor R4 becomes equal to 5 m volts. Since d.c. voltage of input of the operational amplifier becomes equal to VB-Vbe-50 m volts, even if power supply voltage is not high, it becomes possible to operate the circuit at a stable d.c. bias point with respect to unevenness of hfe of transistor.

As stated above, in this embodiment, input impedance is permitted to be higher without use of high-resistance. Accordingly, an input impedance circuit of high impedance can be realized within the semiconductor substrate without externally attaching high impedance resistor of, e.g., 20M ohms or more. In addition, since it is unnecessary to use FET as an operational amplifier, it is possible to form, by bipolar process, a semiconductor device provided with such an input impedance circuit. Particularly in this embodiment, since a capacitor of large capacity which is not suitable for assembling a high input impedance circuit into the semiconductor integrated circuit is eliminated similarly to the above-mentioned second embodiment, realization of semiconductor integrated circuit is facilitated.

Figure 4:
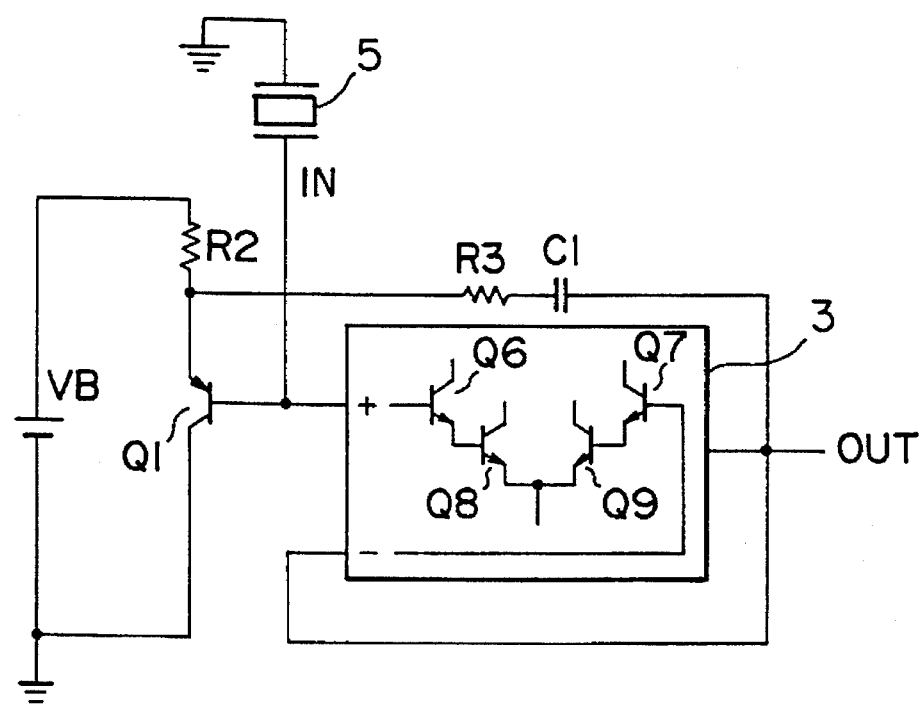
FIG. 4 is a circuit diagram of a high input impedance circuit in which the idea of the third embodiment is applied to the first embodiment.
Figure 5:
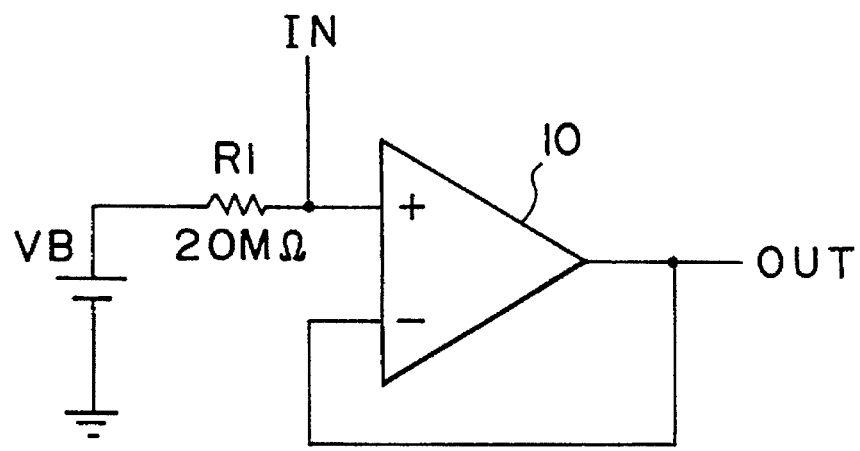
FIG. 5 is a circuit diagram of a conventional high input impedance circuit.
Figure 6:
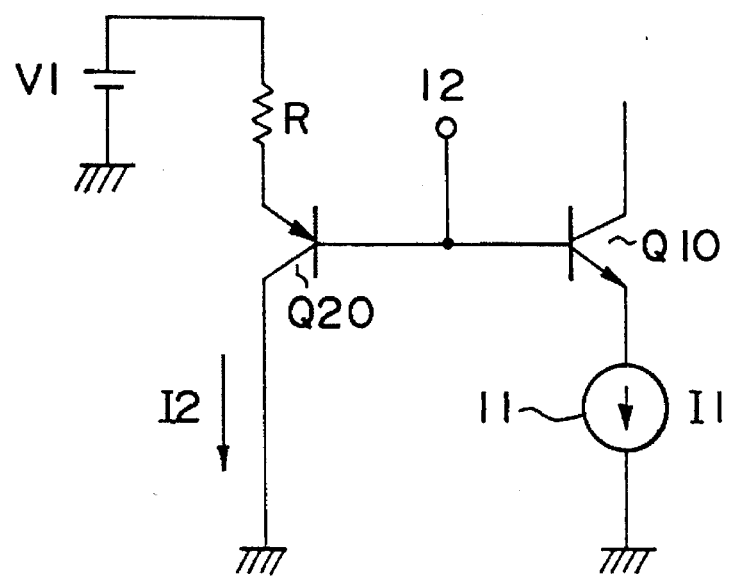
FIG. 6 is a circuit diagram of another conventional high input impedance circuit.

FIG. 4 shows a further embodiment in which the Darlington connection type amplifier 3 as described in the third embodiment is applied to the construction described in the first embodiment.

By this embodiment, both of advantageous effects of the first and third embodiments can be obtained.

While this invention has been described in accordance with the previously described embodiments, these embodiments are presented only for illustrative purpose, and this invention is not therefore limited thereto. This invention can be also applied to a circuit in which, in high input impedance circuits of respective embodiments, PNP transistor is replaced by NPN transistor and NPN transistor is replaced by PNP transistor. Moreover, a circuit in which a portion of transistors constitutes a single transistor of a predetermined polarity by combining a plurality of transistors such as Darlington connection, etc. can also used as transistors which realize this invention. Further, while explanation has been given in the previously described embodiments on the assumption that the relationship of Q4:Q5=R6:R5 holds in the current ratio setting method, such a setting method is merely one example. If values of R5, R6 are arbitrarily set, this setting method has no influence on realization of the high input impedance circuit. It is to be noted that even if R5 and R6 are 0 ohms, this setting method has no influence on the operation of the circuit.

As stated above, in accordance with this invention, since input impedance of the operational amplifier is permitted to be higher without use of high-resistance, it is possible to realize an input impedance circuit of high impedance on the semiconductor substrate without externally attaching high-resistance of, e.g., 20M ohms. In addition, since it is unnecessary to use FET as operational amplifier, it is possible to form, only by bipolar process, a semiconductor device provided with such an input impedance circuit.

What is claimed is:

1. A high input impedance circuit comprising:
   an amplifier including a first and second transistors of a first polarity serving as a differential pair and of a first polarity serving as a differential pair and constituting input stage of the amplifier, base of first transistor of the transistors of the first polarity being caused to serve as a positive input terminal, base of the second transistor of the transistors of the first polarity being caused to serve as a negative input terminal;
   biasing means for providing a d.c. input bias voltage to said positive input terminal, said biasing means including a third transistor of a second polarity opposite to the first polarity, having a base connected to the positive input terminal, and
   means for providing signal of a substantially same phase as an input signal applied to the positive input terminal, for emitter of the third transistors.

2. The high input impedance circuit according to claim 1, wherein said means for providing signal of a same phase negatively feeds back an output signal of the amplifier to the negative input terminal to make the signal appearing at the input terminal substantially same phase and provides the output signal to the emitter of the third transistor.

3. The high input impedance circuit according to claim 1, wherein said third transistor further accompanies a fourth transistor, the third transistor having a base connected through d.c. path to the positive input terminal, a collector connected through d.c. path to a first power supply, and an emitter connected through d.c. path to a second power supply through a resistor, and said fourth transistor having an emitter d.c.-connected to the emitter of the first transistor, a collector d.c.-connected to the first power supply and a base d.c.-connected to the negative input terminal.

4. A high input impedance circuit according to claim 3, wherein said first and second transistors are respectively constructed by two transistors of a same polarity connected in Darlington connection.

5. A high input impedance circuit according to claim 1, wherein said first and second transistors are respectively constructed by two transistors of a same polarity connected in Darlington connection.

6. A semiconductor device comprising:
   an amplifier including a first and second transistors of a first polarity serving as a differential pair and constituting input stage of the amplifier, base of first transistor of the transistors of the first polarity being caused to serve as a positive input terminal, base of the second transistor of the transistors of the first polarity being caused to serve as a negative input terminal;
   biasing means for providing a d.c. input bias voltage to said positive input terminal, said biasing means including a third transistor of a second polarity opposite to the first polarity, having a base connected to the positive input terminal, and
   means for providing signal of a same phase as an input signal applied to the positive input terminal, for emitter of the third transistor,
   said amplifier, said third transistor and means for providing signal being formed on a same semiconductor substrate.

7. A shock sensing device comprising:
   an amplifier including a first and second transistors of a first polarity serving as a differential pair and constituting input stage of the amplifier, base of first transistor of the transistors of the first polarity being cause to serve as a positive input terminal, base of the second transistor of the transistors of the first polarity being cause to serve as a negative input terminal;
   biasing means for providing a d.c. input bias voltage to said positive input terminal, said biasing means including a third transistor of a second polarity opposite to the first polarity, having a base connected to the positive input terminal, and
   means for providing signal of a same phase as an input signal applied to the positive input terminal, for emitter fo the third transistor, said amplifier, said third transistor and means for providing signal being formed on a same semiconductor substrate, and
   a shock sensor connected to the positive input terminal.

8. A high input impedance circuit comprising:

an amplifier including first and second transistors (Q2, Q3) of a first polarity, a base of the first transistor being caused to serve as a positive input terminal, and a base of the second transistor being caused to serve as a negative input terminal, biasing means for providing a d.c. input bias voltage to said positive input terminal, said biasing means including a third transistor (Q1) of a second polarity which is opposite to the first polarity, having a base connected to the positive input terminal, a collector connected to a first power supply, and an emitter connected to a second power supply through a first resistor (R2), and impedance increasing means for increasing input impedance viewed from the positive input terminal of the amplifier on the basis of the relation between currents which flow through the third transistor by an input signal and an output signal, said impedance increasing means being comprised of a second resistor (R3) which is connected between the emitter of the third transistor and output terminal of the amplifier.

9. The high input impedance circuit according to claim 8, wherein a capacitor is serially connected with the second resistor.

10. The high input impedance circuit according to claim 8, wherein said first and second transistors are respectively constructed by two transistors of a same polarity connected in Darlington connection.

11. A high input impedance circuit comprising:

an amplifier including first and second transistors (Q6, Q7) of a first polarity, a base of the first transistor being caused to serve as a positive input terminal, and a base of the second transistor being caused to serve as a negative input terminal, biasing means for providing a d.c. input bias voltage to said positive input terminal, said biasing means including a third transistor (Q5) of a second polarity which is opposite to the first polarity having a base connected to the positive input terminal, a collector connected to a first power supply, and an emitter connected to a second power supply through a first resistor (R4), and impedance increasing means for increasing input impedance viewed from the positive input terminal of the amplifier on the basis of the relation between currents which flow through the third transistor by an input signal and an output signal, said impedance increasing means being comprised of a second resistor (R6) connected between said first resistor and the emitter of the third transistor, and a fourth transistor (Q4) of the second polarity, a base thereof being connected to the negative input terminal, a collector being connected to the first power supply, an emitter thereof being connected to the first resistor through a third resistor (R5).

12. The high input impedance circuit according to claim 11, wherein current amplification factors of the third and fourth transistors are equal and the resistances of the second and third resistors are equal.

13. The high input impedance circuit according to claim 11, wherein current amplification factor of the third transistor is smaller that of the fourth transistor and the resistance of the third resistor is smaller than that of the first resistor.

14. The high input impedance circuit according to claim 11, wherein said first and second transistors are respectively constructed by two transistors of a same polarity connected in Darlington connection.

15. A semiconductor device comprising:

an amplifier including first and second transistors (Q2, Q3) of a first polarity, a base of the first transistor being caused to serve as a positive input terminal, and a base of the second transistor being caused to serve an a negative input terminal, biasing means for providing a d.c. input bias voltage to said positive input terminal, said biasing means including a third transistor (Q1) of a second polarity which is opposite to the first polarity having a base connected to the positive input terminal, a collector connected to a first power supply, and an emitter connected to a second power supply through a first resistor (R2), and impedance increasing means for increasing input impedance viewed from the positive input terminal of the amplifier on the basis of the relation between currents which flow through the third transistor by an input signal and an output signal, said impedance increasing means being comprised of a second resistor (R3) which is connected between the emitter of the third transistor and output terminal of the amplifier, said amplifier, said third transistor and means for providing signal being formed on a same semiconductor substrate.

16. A semiconductor device comprising:

an amplifier including first and second transistors (Q6, Q7) of a first polarity, a base of the first transistor being caused to serve as a positive input terminal, and a base of the second transistor being caused to serve as a negative input terminal, biasing means for providing a d.c. input bias voltage to said positive input terminal, said biasing means including a third transistor (Q5) of a second polarity which is opposite to the first polarity having a base connected to the positive input terminal, a collector connected to a first power supply, and an emitter connected to a second power supply through a first resistor (R4), and impedance increasing means for increasing input impedance viewed from the positive input terminal of the amplifier on the basis of the relation between currents which flow through the third transistor by an input signal and an output signal, said impedance increasing means being comprised of a second resistor (R6) connected between said first resistor and the emitter of the third transistor, and a fourth transistor (Q4) of the second polarity, a base thereof being connected to the negative input terminal, a collector being connected to the first power supply, an emitter thereof being connected to the first resistor through a third resistor (R5), said amplifier, transistor and impedance increasing means being formed on a same semiconductor substrate.

17. A shock sensing device comprising:

an amplifier including first and second transistors (Q2, Q3) of a first polarity, a base of the first transistor being caused to serve an a positive input terminal, and a base of the second transistor being caused to serve as a negative input terminal, biasing means for providing a d.c. input bias voltage to said positive input terminal, said biasing means including a third transistor (Q1) of a second polarity which is opposite to the first polarity having a base connected to the positive input terminal, a collector connected to a first power supply, and an emitter connected to a second power supply through a first resistor (R2), and impedance increasing means for increasing input impedance viewed from the positive input terminal of the amplifier on the basis of the relation between currents which flow through the third transistor by an input signal and an output signal, said impedance increasing means being comprised of a second resistor (R3) which is connected between the emitter of the third transistor and output terminal of the amplifier, and a shock sensor connected to the positive input terminal.

18. A shock sensing device comprising:

an amplifier including first and second transistors (Q6, Q7) of a first polarity, a base of the first transistor being caused to serve as a positive input terminal, and a base of the second transistor being caused to serve as a negative input terminal, biasing means for providing a d.c. input bias voltage to said positive input terminal, said biasing means including a third transistor (Q5) of a second polarity which is opposite to the first polarity having a base connected to the positive input terminal, a collector connected to a first power supply, and an emitter connected to a second power supply through a first resistor (R4), and impedance increasing means for increasing input impedance viewed from the positive input terminal of the amplifier on the basis of the relation between currents which flow through the third transistor by an input signal and an output signal, said impedance increasing means being comprised of a second resistor (R6) connected between said first resistor and the emitter of the third transistor, and a fourth transistor (Q4) of the second polarity, a base thereof being connected to the negative input terminal, a collector being connected to the first power supply, an emitter thereof being connected to the first resistor through a third resistor (R5).

* * * * *